(12) United States Patent
Hurwitz

(10) Patent No.: US 9,312,593 B2
(45) Date of Patent: Apr. 12, 2016

(54) MULTILAYER ELECTRONIC STRUCTURE WITH NOVEL TRANSMISSION LINES

(75) Inventor: Dror Hurwitz, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 213 days.

(21) Appl. No.: 13/483,234

(22) Filed: May 30, 2012

(65) Prior Publication Data

US 2013/0321104 A1 Dec. 5, 2013

(51) Int. Cl.
| | |
|---|---|
| *H01P 11/00* | (2006.01) |
| *H01P 3/08* | (2006.01) |
| *H05K 1/02* | (2006.01) |
| *H05K 3/46* | (2006.01) |

(52) U.S. Cl.
CPC ............... *H01P 11/003* (2013.01); *H01P 3/08* (2013.01); *H01P 3/081* (2013.01); *H01P 3/085* (2013.01); *H05K 1/0242* (2013.01); *H01L 2924/0002* (2013.01); *H05K 1/0218* (2013.01); *H05K 3/4647* (2013.01); *H05K 2201/0723* (2013.01); *H05K 2201/0979* (2013.01); *H05K 2201/09618* (2013.01); *H05K 2201/09672* (2013.01); *Y10T 29/49155* (2015.01)

(58) Field of Classification Search
CPC ............. H01P 3/18; H01P 3/082; H01P 3/08; H01P 3/081; H01P 3/085; H01P 11/003; H05K 3/4644; H05K 1/0218; H05K 1/0242; H05K 3/4647; H05K 2201/0723; H05K 2201/09618; H05K 2201/09672; H05K 2201/0979; H01L 2924/0002
USPC ...................................... 333/1, 4, 5, 238, 246
See application file for complete search history.

(56) References Cited

U.S. PATENT DOCUMENTS

| | | | |
|---|---|---|---|
| 6,353,189 B1 | 3/2002 | Shimada | |
| 7,193,490 B2 * | 3/2007 | Shimoda | 333/246 |
| 7,635,641 B2 | 12/2009 | Hurwitz et al. | |
| 7,669,320 B2 | 3/2010 | Hurwitz et al. | |
| 7,682,972 B2 | 3/2010 | Hurwitz et al. | |
| 2003/0043001 A1* | 3/2003 | Aruga | 333/246 |
| 2003/0151476 A1* | 8/2003 | Salmela et al. | 333/243 |
| 2008/0093691 A1* | 4/2008 | Busta | 257/415 |
| 2010/0225424 A1* | 9/2010 | Yeates | 333/238 |
| 2011/0308840 A1 | 12/2011 | Ooi et al. | |

FOREIGN PATENT DOCUMENTS

KR 2001-0006198 1/2001

OTHER PUBLICATIONS en.wikipedia.org/wiki/fiberglass : Access on May 14, 2014 : Fiberglass Explanation.*
www.dictionary.com : Access on May 14, 2014: Definition of the term "Discontinuous".*

* cited by examiner

*Primary Examiner* — Benny Lee
*Assistant Examiner* — Jorge Salazar, Jr.
(74) *Attorney, Agent, or Firm* — Wiggin and Dana LLP; Gregory S. Rosenblatt; Jonathan D. Hall

(57) ABSTRACT

A signal carrier for carrying a signal in a direction within the X-Y plane of a multilayer composite electronic structure comprising a plurality of dielectric layers extending in an X-Y plane, the signal carrier comprising a first transmission line comprising a lower continuous metallic layer and further comprising a row of metallic via posts coupled to the continuous metal layer, wherein the transmission line is separated by a dielectric material from an underlying reference plane.

21 Claims, 7 Drawing Sheets

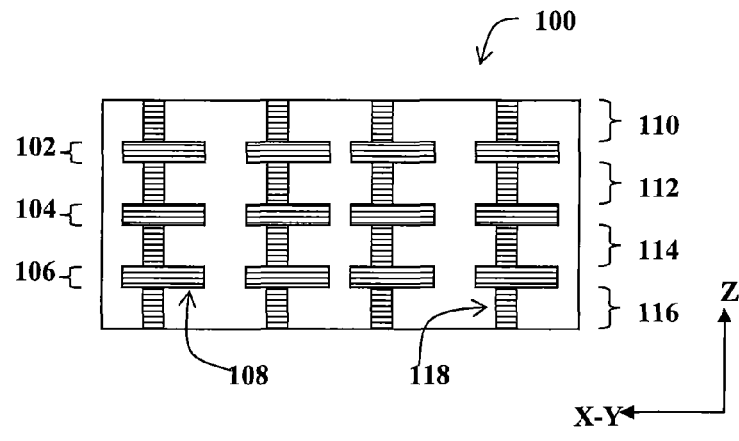
PRIOR ART
Fig. 1
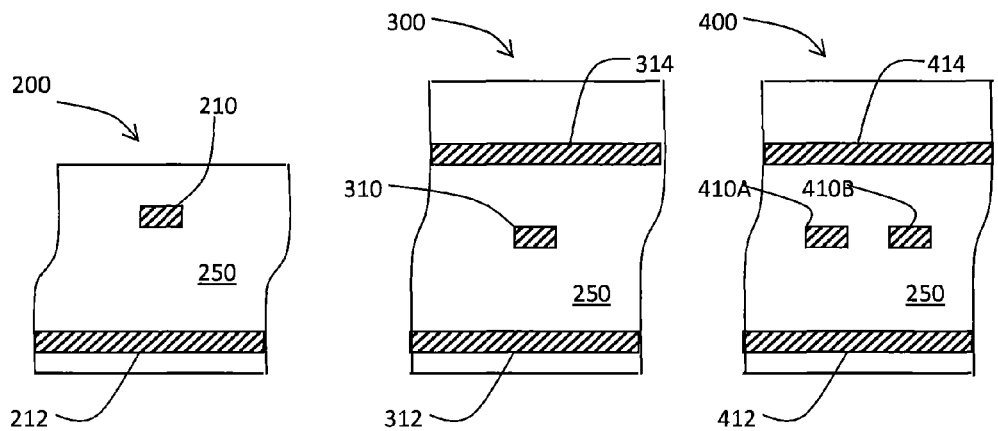
Fig. 2
PRIOR ART
Fig. 3
PRIOR ART
Fig. 4
PRIOR ART

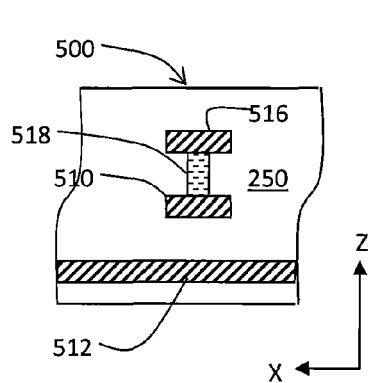
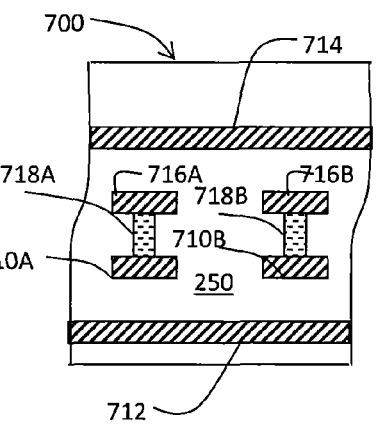
Fig. 5    Fig. 6    Fig. 7
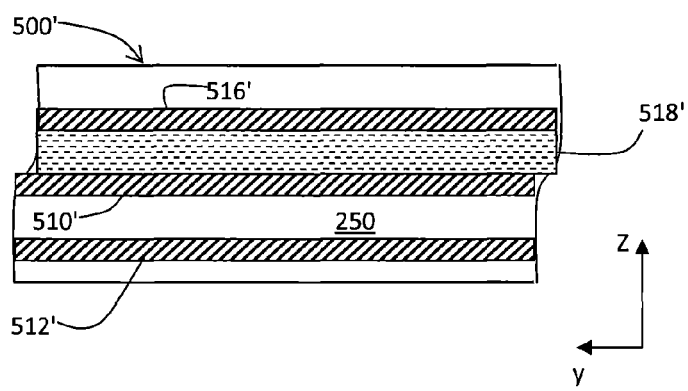
Fig. 8

MULTILAYER ELECTRONIC STRUCTURE WITH NOVEL TRANSMISSION LINES

BACKGROUND

1. Field of the Disclosure

Embodiments of the present invention relate to support structures for electronic components, and particularly to interconnects and interposers and their methods of manufacture.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are, however, a number of disadvantages with the drilled & filled via approach:

Since each via is required to be separately drilled, the throughput rate is limited, and the costs of fabricating sophisticated, multi-via IC substrates and interposers becomes prohibitive.

In large arrays it is difficult to produce a high density of high quality vias having different sizes and shapes in close proximity to each other by the drill & fill methodology.

Furthermore, laser drilled vias have rough side walls and taper inwards through the thickness of the dielectric material. This tapering reduces the effective diameter of the via. It may also adversely affect the electrical contact to the previous conductive metal layer especially at ultra small via diameters, thereby causing reliability issues.

The side walls are particularly rough where the dielectric being drilled is a composite material comprising glass or ceramic fibers in a polymer matrix, and this roughness may create additional stray inductances.

The filling process of the drilled via holes is usually achieved by copper electroplating. This metal deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers.

Large via channels are difficult to fill uniformly, especially when they are in proximity to smaller vias within the same interconnecting layer of the interposer or IC substrate design.

Laser drilling is best for creating round via channels. Although slot shaped via channels may be fabricated by laser milling, nevertheless, the range of geometries that may be fabricated by 'drill & fill' is somewhat limited. Fabrication of vias by drill & fill is expensive and it is difficult to evenly and consistently fill the via channels created thereby with copper using the relatively, cost-effective electroplating process.

Although the range of acceptable sizes and reliability is improving over time, the disadvantages described hereinabove are intrinsic to the drill & fill technology and are expected to limit the range of possible via sizes.

An alternative solution that overcomes many of the disadvantages of the drill & fill approach, is to fabricate vias by depositing copper or other metal into a pattern created in a photoresist, using a technology otherwise known as 'pattern plating'.

In pattern plating, a seed layer is first deposited. Then a layer of photoresist is laid down over the seed layer and subsequently exposed to create a pattern, which is selectively removed to leave trenches that expose the seed layer. Via posts are created by depositing copper into the photoresist trenches. The remaining photoresist is then removed, the seed layer is etched away, and a dielectric material that is typically a polymer impregnated glass fiber mat, is laminated thereover and therearound to encase the via posts. Various techniques and processes, such as grinding, polishing and chemical mechanical polishing may then be used to thin down and planarize the surface, by removing part of the dielectric material to expose the top of the via posts, allowing building up the next metal layer. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photoresist is laid on top of the continuous layer, and a pattern is developed therein. The pattern of developed photoresist is stripped away, selectively exposing the metal thereunder, which may then be etched away. The undeveloped photoresist protects the underlying metal from being etched away, and leaves a pattern of upstanding features and vias.

After stripping away the undeveloped photoresist, a dielectric material, such as a polymer impregnated glass fiber mat, may be laminated around and over the upstanding copper features and/or via posts.

The via layers created by pattern plating or panel plating methodologies described above are typically known as via post layers and feature layers. Copper is a preferred metal for both layers.

It will be appreciated that the general thrust of the microelectronic evolution is directed towards fabricating ever smaller, thinner and lighter and more powerful products having high reliability. The use of thick, cored interconnects, prevents ultra-thin products being attainable. To create ever higher densities of structures in the interconnect IC substrate or interposer; ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer, typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround. The first IC die is bondable onto the IC support, and the second IC die is bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of: (A) selecting a first base layer; (B) depositing a first adhesive etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photoresist to the second base layer; (F) etching away the first base layer; (G) removing the protective coating of photoresist; (H) removing the first adhesive etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

BRIEF SUMMARY

A first aspect of the invention is directed to a signal carrier for carrying a signal in a direction within the X-Y plane of a multilayer composite electronic structure comprising a plurality of dielectric layers extending in an X-Y plane, the signal carrier comprises a first transmission line comprising a lower continuous metallic layer and further comprising a row of metallic via posts coupled to the continuous metal layer, wherein the transmission line is separated by a dielectric material from an underlying reference plane.

In some embodiments, the signal carrier comprises an upper continuous layer coupled to the row of via posts from above.

In some embodiments, the signal carrier comprises an overlying reference plane separated from the row of via posts by a layer of dielectric material.

In some embodiments, the row of via posts is continuous.

In some embodiments, the row of via posts is discontinuous.

In some embodiments, the lower continuous layer comprises a seed layer.

In some embodiments, the seed layer comprises copper.

In some embodiments, the lower continuous layer further comprises an electroplated metal layer.

In some embodiments, the electroplated metal layer comprises copper.

In some embodiments, the upper continuous layer coupled to the row of via posts from above comprises a metal seed layer.

In some embodiments, the upper continuous layer further comprises a plated metal layer.

In some embodiments, the signal carrier further comprises a second transmission line adjacent to the first transmission line.

In some embodiments, the dielectric material comprises a polymer.

In some embodiments, the polymer is selected from the group comprising polyimide, epoxy, Bismaleimide, Triazine and blends thereof.

In some embodiments, the dielectric material further comprises ceramic or glass.

In some embodiments, the dielectric material comprises glass fibers.

In some embodiments, the dielectric material comprises particle fillers.

A second aspect is directed to providing a method of fabricating a signal carrier for carrying a signal in a direction within the X-Y plane of a multilayer composite electronic structure comprising a plurality of dielectric layers extending in an X-Y plane, the signal carrier comprising a first transmission line comprising a lower continuous metallic layer and further comprising a row of metallic via posts coupled to the continuous metal layer, wherein the transmission line is separated by a dielectric material from an underlying reference plane, the method comprising the steps of:
 (a) obtaining a substrate with an upper surface comprising a continuous metal reference plane;
 (b) covering the continuous metal reference plane with a layer of dielectric;
 (c) fabricating bottom conducting line;
 (d) fabricating a row of via posts by pattern plating or by panel plating;
 (e) laminating a dielectric layer over the row of via posts;
 (f) thinning to expose the top surface of the row of via posts;
 (g) depositing top conducting lines, and
 (h) laminating an upper layer of dielectric material over the top conducting line.

Optionally, step (b) comprises the substeps of:
b(i) depositing a first layer of photoresist;
b(ii) developing a pattern in the photoresist, including no features or vias in area of signal carrier;
b(iii) electroplating copper into the pattern;
b(iv) removing the first layer of photoresist, and
b(v) laminating a dielectric layer over the copper vias.

Optionally, step (b) comprises the substeps of:

b(vi) panel plating a copper layer over the continuous metal reference plane;
b(vii) depositing a first layer of photoresist over the copper layer;
b(viii) developing a pattern protecting surrounding vias and features but not protecting copper in the region of the signal carrier;
b(ix) etching the copper is away;
b(x) removing the first layer of photoresist, and
b(xi), depositing a dielectric layer thereover.

Typically, steps (c) and (g) comprise the substeps of:
(ii) depositing a seed layer;
(iv) covering with dielectric;
(v) patterning a protective layer to protect the conducting line;
(vi) dissolving away the surrounding metal.

In some embodiments, steps (c) and (g) comprise at least one of the additional steps:
(1) applying an adhesion metal;
(2) electroplating a metal layer over the seed layer.

In some embodiments, the method further comprises a step (i) of depositing an upper reference plane comprising a seed layer thereover.

In some embodiments, the upper reference plane further comprises at least one of: preliminarily depositing a preliminary adhesion metal, and subsequently electroplating a metal layer.

In some embodiments, steps (c) to (g) comprise creating two adjacent I-shaped transmission lines by either panel plating with selective etching or by pattern plating the bottom conducting line, the row of via posts and the top conducting line, leaving the two adjacent I shaped transmission lines embedded in dielectric.

The term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 1 is a section through a multilayer electronic support structure of the prior art;
FIG. 2 shows a section across a micro-strip arrangement of the prior art;
FIG. 3 shows a section across a strip line conductor arrangement of the prior art;
FIG. 4 shows a section across a differential pair strip line arrangement of the prior art;
FIG. 5 shows a section across a micro strip transmission line structure;
FIG. 6 shows a section across a strip line transmission line structure;
FIG. 7 shows a section across a differential pair strip line transmission line;
FIG. 8 shows a section along the micro strip transmission line structure of FIG. 5 in where the via row is a continuous row.

Like reference numbers and designations in the various drawings indicated like elements.

DETAILED DESCRIPTION

Figure 9:
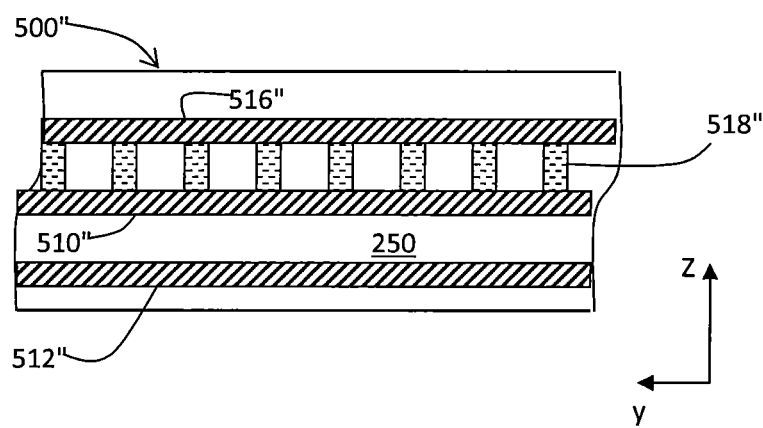
FIG. 9 shows a section along the micro strip transmission line structure of FIG. 5 in where the via row is a row of via posts.

In the description herein below, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. Nos. 7,682,972, 7,669,320 and 7,635,641 to Hurwitz et al., incorporated herein by reference, that there is no effective upper limit to the in-plane dimensions of a feature.

FIG. 1 is a simplified section through a multilayer composite support structure of the prior art. Multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between the adjacent functional or feature layers. Thus the feature layers 102, 104, 106 include features 108 generally laid out within the layer, in the X-Y plane, and vias 118 that conduct current across the dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section.

As described in U.S. Pat. Nos. 7,682,972, 7,669,320 and 7,635,641, for example, the structure of FIG. 1 may alternatively be fabricated by plating in a pattern in a photo-resist (pattern plating), or panel plating and then selectively etching, either way leaving up standing via posts, and then laminating a dielectric pre-preg thereover.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

It has been surprisingly found that using the flexibility of the plating and photo-resist techniques, a wide range of via shapes and sizes may be cost-effectively fabricated. Furthermore, different via shapes and sizes may be fabricated in the same layer. The proprietary via post approach developed by AMITEC, enables 'conductor via' structures that utilize the large dimensions of the via layer to conduct in the x-y plane. This is especially facilitated when the copper pattern plating approach is used, where smooth, straight, non-tapering trenches may be produced in a photo-resist material, and then filled by subsequently depositing copper into these trenches by using a metal seed layer and then filling by pattern plating copper into the trenches. In contrast to the drilled & filled via approach, via post technology enables trenches in a photoresist layer to be filled to obtain dimple-less, dome-less copper connectors. After deposition of the copper the photoresist is subsequent stripped away, the metal seed layer is subsequently removed and a permanent, polymer-glass dielectric is applied thereover and therearound. The 'via conductor' structure thus created may use the process flows as described in U.S. Pat. Nos. 7,682,972, 7,669,320 and 7,635,641 to Hurwitz et al.

In many individual electronic substrates, connections between substrates and printed circuit boards, the length of the metal conductive connections that connect ICs and other electrical components to each other may generally be ignored. Expressed differently, the voltage across the conductive connection at a given time can be assumed to be zero and the potential at all points can be considered as being the same. However, in applications where the voltage changes in a time interval comparable to the time it takes for the electrical signal to travel across the conductive element, the length of the conductive element may become significant, and the conductor must be treated as a transmission line. Stated another way, the length of the conductive element and its associated interconnecting vias is important when the signal includes a frequency component with a corresponding wavelength that is comparable to or less than the length of the conductive element. A common rule of thumb is that the conductive element should be treated as a transmission line if its total length is greater than 1/10 of the wavelength. At such lengths, the phase delay and the interference of any reflection of the conductive element becomes important and can lead to unpredictable behavior in structures which have not been carefully designed using transmission line theory. The transmission line condition may occur with substrates operating with radio and microwave electrical signals and with signals found in high speed digital circuitry, for example.

If a transmission line is uniform along it length, its behavior is largely described by a single parameter that may be known as the 'characteristics impedance', symbol $Z_0$. The 'characteristics impedance' is the ratio of the complex voltage of a given wave to the complex current of the same wave at any point of the conductor line.

There are a number of transmission lines that are used in substrates for actively carrying data. Other components not designed to actively carry data may be considered as transmission lines to calculate the stray signals created thereby.

With reference to FIGS. 2, 3 and 4, three typical transmission line configurations are described. FIG. 2 shows a microstrip arrangement 200, FIG. 3 shows a strip line conductor arrangement 300, and FIG. 4 shows a differential pair strip line arrangement 400.

Typical values of $Z_0$ for IC substrate transmission line conductors are 50 to 75 ohms for micro-strip 200 and strip line 300 conductor arrangements as shown in FIGS. 2 and 3, and 100 ohms for differential pair strip line arrangement 400 such as shown in FIG. 4. In FIGS. 2, 4 and 4, the dielectric material of the substrate 250 separates transmission line conductors 210, 310, 410A, 410B from their reference (ground or power) planes 212, 312, 314 and 412, 414.

It will be appreciated that when sending power down a transmission line, it is usually desirable that as much power as possible will be absorbed by the load and as little as possible will be reflected back to the source. This can be ensured by making the load impedance equal to $Z_0$, in which case the transmission line is said to be 'matched' or 'controlled'. One way to maintain a conductor as a 'controlled' transmission line with a constant impedance value is to maintain a constant geometrical relationship between its width, thickness and its vertical distance from the reference ground (or power) plane. It is also important to correctly choose the right dielectric material, with the appropriate dielectric constant value to insulate the conductor from its reference plane.

Without wishing to be bound by any specific theory, this may generally be explained as follows: Some of the power that is fed into a transmission line is lost because of the transmission line's resistance. This lost current may be referred to as the "ohmic" or resistive loss. At high frequencies, another effect called "dielectric loss" becomes significant, adding to the losses caused by resistance. Dielectric loss is caused when the insulating material inside the substrate absorbs energy from the alternating electrical field and converts it to heat.

A substrate can usually be designed and fabricated with an appropriate dielectric material having the proper dielectric constant and proper vertical thickness from the transmission line to its ground (power) reference plane in order to achieve a desired $Z_0$ value. However, in many cases, the width and thickness of the conductor become an issue due to the small area available in the substrate. Furthermore, there may be difficulties in achieving high conductor thickness to width ratios, due to processing limitations.

Embodiments are directed to 'conductor via' structures that interconnect two vertically separated and aligned X-Y conductors planes to form one transmission line structure.

With reference to FIG. 5 a reference plane 512 is spaced from two, top and bottom, conductors lines 510, 516 that are interconnected by a via conductor 518 and encapsulated in a dielectric material 250 to form a micro strip transmission line structure 500. The reference plane 512 may be a power reference plane or a ground reference plane.

It will be appreciated that the width of the two conductor lines 510, 516 may be minimized, to be close to or identical to the width of the via conductor 518, since the DC resistance of the micro strip transmission line thus formed will be controlled by the bulk properties of the via conductor 518.

It will further be appreciated that the bottom conductor line 510 need only be thick enough to serve as seed layer to allow the via conductor 518 to be pattern electroplated (together with other conductors and via posts in the same layer of the substrate (not shown), substantially as described in the pattern plating via post process flow of U.S. Pat. Nos. 7,682,972, 7,669,320 and 7,635,641 to Hurwitz et al.

Furthermore, it will be appreciated that the top conductor line 516 may similarly have minimal thickness. Indeed, the thickness in the micro strip transmission line of FIG. 5 is generally dictated by other areas of the same layer generally serving as a seed layer for other conductor structures (not shown), elsewhere in the substrate. The micro strip transmission line 500 shown in FIG. 5 may be fabricated using pattern plating process as described in U.S. Pat. Nos. 7,682,972, 7,669,320 and 7,635,641 to Hurwitz et al.

FIG. 6 shows a strip line transmission line structure 600 consisting of a dielectric material 250, a pair of top and bottom, metal ground reference planes 612, 614 spaced from a pair of, top and bottom, conductors lines 610, 616 that are interconnected by a via conductor 618.

As will be noted by persons familiar with this art, the two conductor lines 610, 616 may be minimized in width to be close to or identical to the width of via conductor 618, since the DC resistance of the formed strip line transmission line 600 is largely dictated by the bulk properties of the via conductor 618. Using the same reasoning, it will further be noted that as with bottom conducting line 510 of FIG. 5, mutatis mutandis, the bottom conductor lines 610 may be very thin, and its thickness is dictated by it serving as a seed layer to allow the via conductor 618 (and other conductors and via posts (not shown) in the same layers, at other locations of the substrate, to be pattern electroplated, using the technology generally as described in the pattern plating via post process flows of U.S. Pat. Nos. 7,682,972, 7,669,320 and 7,635,641 to Hurwitz et al.

The metal seed layer is typically 0.5 micron to 1.5 micron thick and may comprise copper, and may be deposited by sputtering or by electroless plating. It may further comprise an underlying adhesive layer of a different metal that may be fabricated from titanium, chrome or nickel-chrome, for example, and will typically have a thickness in the range of 0.04 microns to 0.1 microns. Furthermore, it will be noted that the thickness of the top conducting line 616 may be made thin enough for the purpose of only serving as a seed layer to allow other conductors (not shown) to be build on the same layer, elsewhere in the substrate using pattern plating process as described in U.S. Pat. Nos. 7,682,972, 7,669,320 and 7,635,641 to Hurwitz et al.

FIG. 7 shows a differential pair strip line transmission line 700 consisting of a dielectric material 250 and bottom and top ground reference planes 712, 714 spaced from two pairs bottom conductor lines 710A, 710B and top conductor lines 716A, 716B that are interconnected by corresponding via conductors 718A, 718B. Persons of the art will appreciate that the two conductor pair lines 710A/716A and 710B/716B may be minimized in width to be close to or identical with the widths of the corresponding via conductors 718A, 718B respectively, since the DC resistance of the formed differential pair strip line transmission lines 700 will be dictated by the bulk properties of the via conductors 718A, 718B. Using the same reasoning, it should be noted that the bottom conducting lines 710A, 710B need be thick enough only for the purpose of serving as seed layer to allow the corresponding via conductors 718A, 718B to be pattern electroplated, typically together with other conductors and via posts (not shown) in the same layer but at other location of the substrate generally as described in the pattern plating via post process flow of U.S. Pat. Nos. 7,682,972, 7,669,320 and 7,635,641 to Hurwitz et al. Furthermore, as described hereinabove with reference to FIGS. 5 and 6 mutatis mutandis, it will be appreciated that the top conducting lines 716A, 716B may be made thin enough for the purpose of only serving as a seed layer to allow other conductors (not shown) to be build at the same layer, elsewhere in the substrate, using pattern plating process as described in U.S. Pat. Nos. 7,682,972, 7,669,320 and 7,635,641 to Hurwitz et al.

With reference to FIG. 8, one micro strip transmission line structure 500' is shown from a direction perpendicular to that shown in FIG. 5. Here the via conductor 518' is a continuous electroplated via line.

With reference to FIG. 9, an alternative micro strip transmission line structure 500" is shown from a direction perpendicular to that shown in FIG. 5. Here the via conductor 518" is series of equally shaped via posts, which, as well be appreciated by persons of the art, can support a carrier wave of appropriate characteristics, such as having a wavelength of twice the post separation distance and an amplitude of the height of the I shaped structure.

It will be appreciated that not only may the micro strip transmission line structure 500 include a continuous via line 518' or series of posts 518", but similarly, the strip line transmission line structure 600 and the differential pair strip line transmission line 700 may include continuous via lines or series of posts.

Figure 10:
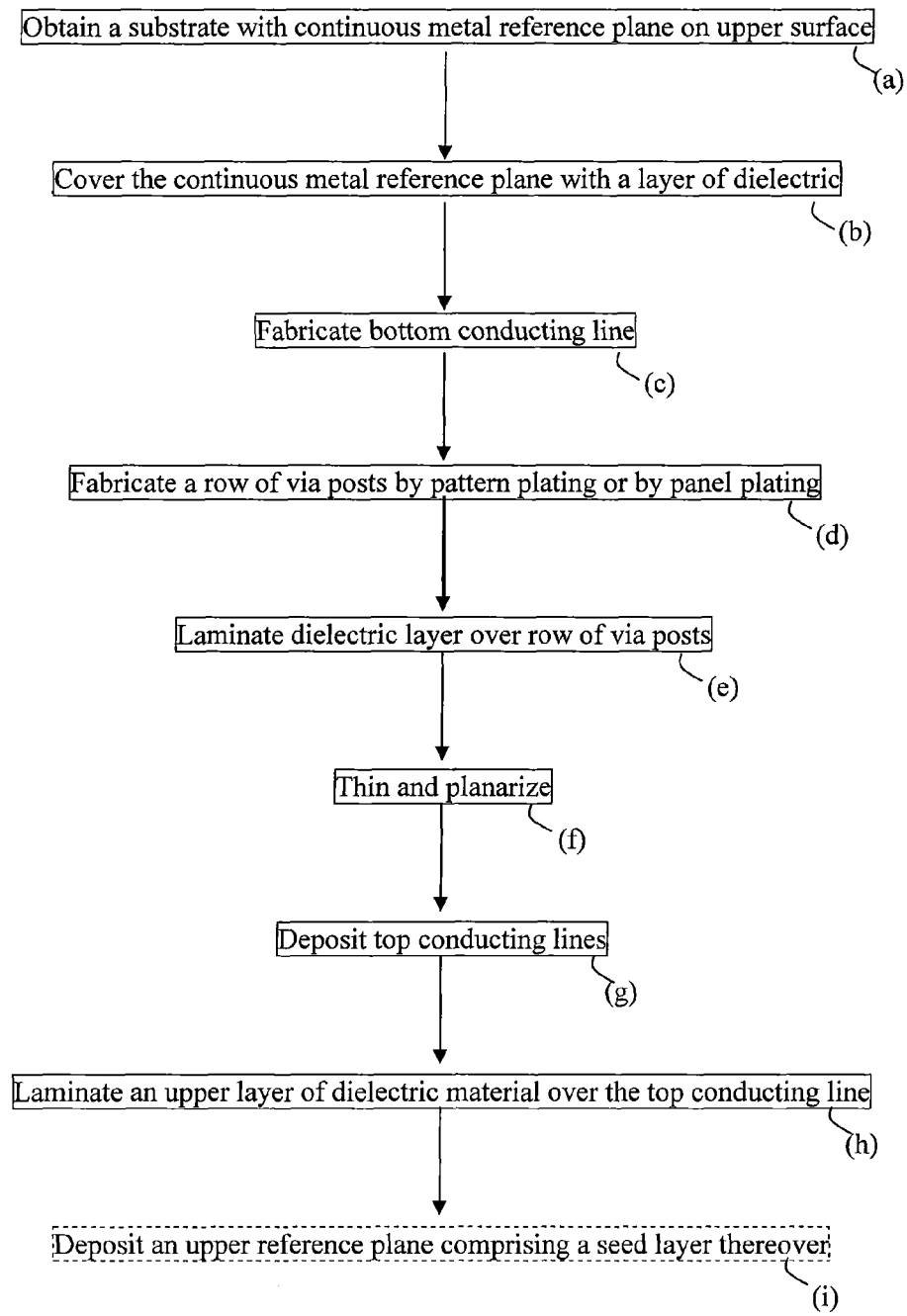
FIG. 10 is a flowchart showing one manufacturing technique.

With reference to FIG. 10, a general manufacturing process for fabricating the devices of FIGS. 5, 6 and 7 is now presented. The subcomponents of FIGS. 5, 6 and 7 are referenced for ease of comprehension.

The method comprises the steps of: obtaining a substrate with an upper surface comprising a continuous metal reference plane 512 (612, 712)—step (a). The continuous metal plane may be a metal substrate, a seed layer such as 0.5 microns to 1.5 microns of copper, with or without an underlying adhesive metal such as Ti, Ta, W or Cr to aid adhesion to an underlying dielectric material. It may be an electroplated copper layer that may be a feature or a via layer, since the construction described may be part of a larger multilayer structure with additional features and vias.

The continuous metal reference plane is now covered with a layer of dielectric —step (b).

For ease of comprehension, the rest of the description of the method relates ONLY to fabricating the sections shown in FIGS. 5 to 7. Persons of the art will, however, have no difficulty in making the necessary adaptations to this method to relate to the surrounding features which are generally panel or pattern plated thereinto.

Bottom conducting lines are now fabricated. A seed layer is deposted over the dielectric layer—step (c). Typically the seed layer is copper and may be deposited by sputtering or by electroless plating. To aid adhesion, it may include a preliminary adhesion layer of tantalum, titanium, chromium or tungsten, for example. The seed layer may be 0.5 micron to 1.5 micron thick and will typically be about 1 micron thick.

For the purposes of the bottom conducting lines, the thin seed layer is adequate. For the purpose of surrounding components, a layer of copper may be electroplated therearound, either by pattern plating or by panel plating. Either way, the resultant bottom conducting line may be the width of the via conductor grown thereover or may be slightly wider —so the surrounding seed layer must be etched away—step (d).

A row of via posts is now fabricated by pattern plating or by panel plating—step (e). The row of via posts may be a continous structure (618'—FIG. 8), i.e. a via strip, or may be a row of evenly spaced via posts (618"—FIG. 9) with dimensions and spacing appropriate to serve as a wave guide. A dielectric layer is laminated over the row of via posts and then thinned to expose the top surface of the row of via posts—step (f). Top conducting lines are now deposited—step (g).

An upper layer of dielectric material may be laminated over the top conducting line—step (h). The method thus far, may produce the micro strip transmission line structure 500 of FIG. 5, with its I shaped transmission line.

Depositing an upper reference plane 614—step (i) thereover, creates the strip line transmission line structure 600 of FIG. 6. This may be a metal seed layer, and may have an additional metal layer pattern or panel electroplated thereover; with an effective panel over the I shaped transmission line.

To create the differential pair strip line transmission line 700 of FIG. 7, steps (c) to (g) may be adapted to create two adjacent I shaped transmission lines A, B by either panel plating with selective etching or by pattern plating the bottom conducting lines 710A, 710B, the row of via posts 718 (which may be continuous or discontinuous), and the top conducting line 716, leaving the two adjacent I shaped transmission lines A, B embedded in dielectric.

In general, the devices shown herein are part of larger multilayer structures, and this layer of dielectric will, in general have via posts therein, created by technologies as described in U.S. Pat. Nos. 7,682,972, 7,669,320 and 7,635,641 to Hurwitz et al.

By way of example, the step (b) of covering with a layer of dielectric is typically part of a method of fabricating surrounding vias.

Figure 11:
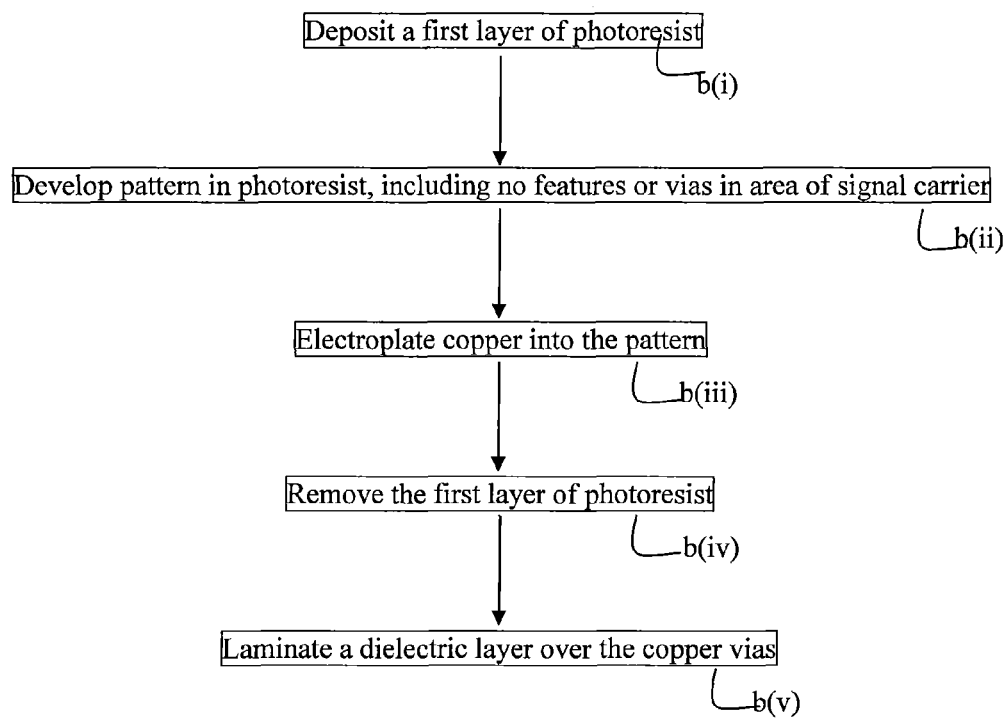
FIG. 11 shows one way of performing step (b) of the flowchart of FIG. 10.

Referring to FIG. 11, one way of fabricating a layer of dielectric under the bottom conducting line whilst simultaneously fabricating surrounding vias and/or features is by pattern plating as follows: a first layer of photoresist is deposited—(b(i). a pattern is developed in the photoresist, including no features or vias in the section shown—step b(ii). Copper is electroplated into the pattern—step b(iii) and the first layer of photoresist is removed—step b(iv) and a dielectric layer is laminated over the copper vias—step b(v).

Where no elements of the second layer extend beyond the first layer, it may be possible to remove the photoresist and to deposit a second layer of photoresist over the exposed features, patterning a second layer over the first layer, and then depositing the second layer by electroplating or electroless plating. After stripping the second layer of photoresist, a dielectric material may be laminated over the first and second layers.

Figure 12:
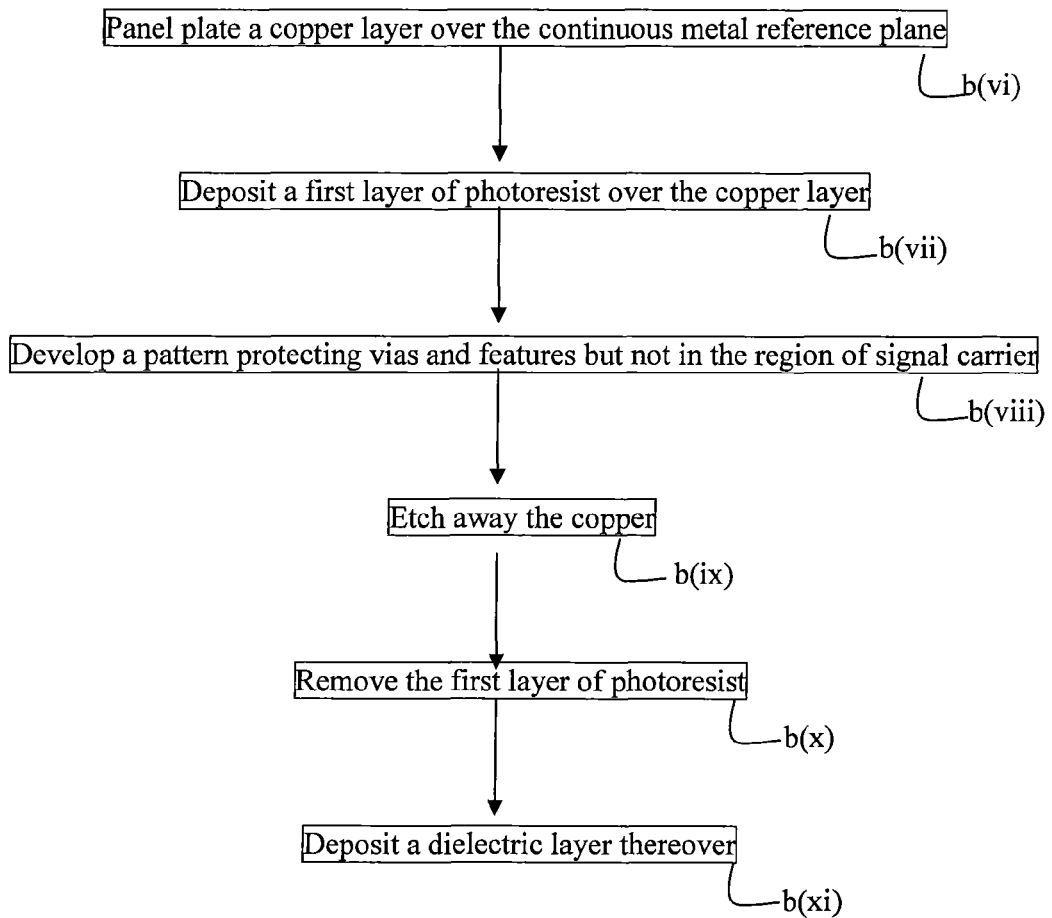
FIG. 12 shows another way of performing step (b) of flowchart of FIG. 10.

Referring to FIG. 12, alternatively, surrounding vias may be fabricated by panel plating as follows: copper is electroplated as a panel—step b(vi), and a first layer of photoresist is deposited thereover—b(vii). A pattern including surrounding vias and features but no features or vias in the section shown is developed—step b(viii) and the copper is etched away—step b(ix). The first layer of photoresist is then removed—step b(x), and a dielectric layer is deposited thereover—step b(xi).

The vias could, however, be fabricated by other techniques, such as retrofitted to the dielectric by drill & fill technology, for example.

Figure 13:
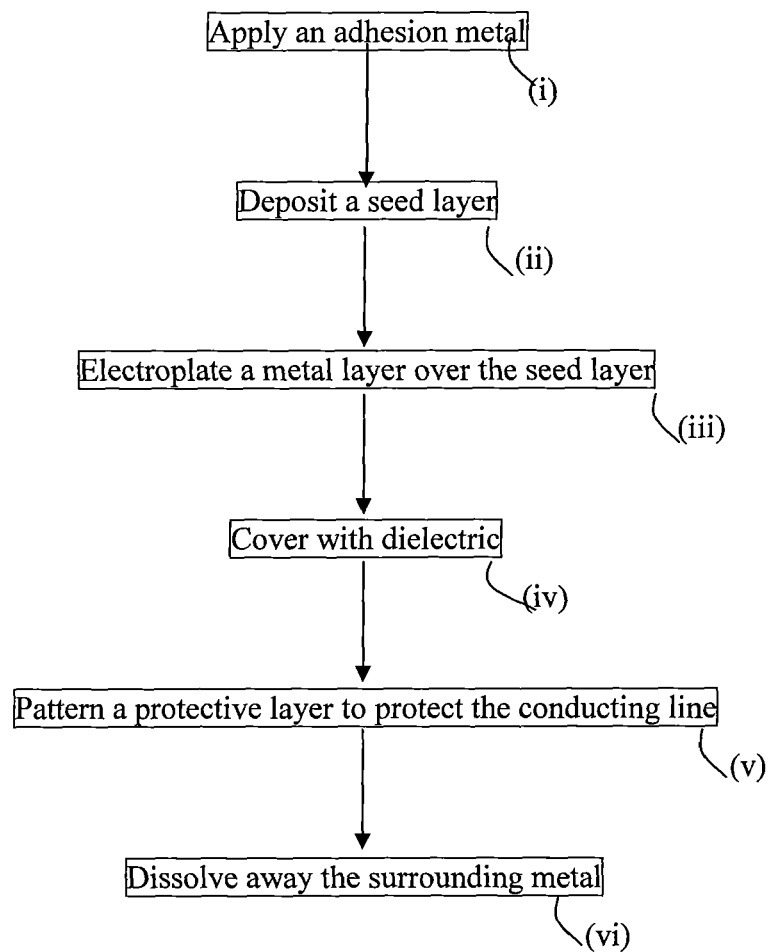
FIG. 13 shows one way of performing steps (c) and (g) of the flowchart of FIG. 10.

Referring to FIG. 13, the step (g) of creating the top conducting line may be accomplished by depositing an upper seed layer—step g(ii). Once again, an adhesion metal may be first applied—step g(i) to aid adhesion to the dielectric, and a thicker electroplated layer may be deposited over the seed layer above the row of via posts—step g(iii). After depositing a continuous protective strip over the row of via posts—step g(iv), the surrounding metal is dissolved away—step g(v), leaving the upstanding top conducting line.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A method of fabricating a signal carrier for carrying a signal in a direction within an X-Y plane of a multilayer composite electronic structure comprising a plurality of dielectric layers extending in the X-Y plane, the signal carrier comprising a transmission line comprising a lower continuous metallic line and a metallic via line that comprises either a continuous via post or discrete via posts, the metallic via line stands on and are conductively coupled to the lower continuous metal line, wherein the transmission line is separated by a lower layer of the plurality of dielectric layers from an underlying continuous metal reference plane, comprising the steps of:
   (a) obtaining a substrate; depositing thereover the continuous metal reference plane;
   (b) covering the continuous metal reference plane with the lower layer of the plurality of dielectric layers;
   (c) fabricating the lower continuous metallic conducting line;
   (d) fabricating the metallic via line over the lower continuous metallic conducting line by pattern plating or by panel plating;
   (e) laminating a further dielectric layer of the plurality of dielectric layers over the metallic via line and the lower continuous metallic conducting line;
   (f) thinning the further dielectric layer to expose a top surface of the metallic via line;
   (g) depositing a top conducting line over the metallic via line, and
   (h) laminating an upper layer of the plurality of dielectric layers over the top conducting line.

2. The method of claim 1 wherein the lower dielectric layer of step (b) comprises polymer.

3. The method of claim 2 wherein the lower dielectric layer of step (b) comprises a polymer membrane.

4. The method of claim 2 wherein the further dielectric layer of step (e) further comprises ceramic or glass filler.

5. The method of claim 2 wherein the polymer comprises at least one of polyimide, epoxy and Bismaleimide Triazine.

6. The method of claim 2 wherein the lower dielectric layer further comprises glass fibers.

7. The method of claim 1 wherein the continuous metallic conducting line of step (c) is fabricated by sputtering an adhesive metal layer onto the lower dielectric layer, and then sputtering a copper layer thereover.

8. The method of claim 1 wherein the further dielectric layer of step (e) comprises polymer.

9. The method of claim 8 wherein the further dielectric layer of step (e) further comprises ceramic or glass filler.

10. The method of claim 8 wherein the polymer comprises at least one of polyimide, epoxy and Bismaleimide Triazine.

11. The method of claim 8 wherein the polymer includes a filler selected from the group consisting of glass fibers, particle fillers and mixtures thereof.

12. The method of claim 8 wherein the further dielectric layer is provided as a polymer membrane.

13. The method of claim 8 wherein the thinning of step (f) comprises at least one of chemical polishing, mechanical grinding and chemical mechanical polishing.

14. The method of claim 1 wherein the upper dielectric layer of step (h) comprises polymer.

15. The method of claim 14 wherein the polymer of step (h) further comprises ceramic or glass filler.

16. The method of claim 14 wherein the polymer comprises at least one of polyimide, epoxy and Bismaleimide Triazine.

17. The method of claim 14 wherein the polymer includes a filler selected from the group consisting of glass fibers, particle fillers and mixtures thereof.

18. The method of claim 14 wherein the upper dielectric layer is provided as a polymer membrane or as a fiber reinforced resin prepreg.

19. The method of claim 1 further comprising a step (i) of depositing an upper reference plane comprising a seed layer thereover.

20. The method of claim 19, wherein the upper reference plane further comprises at least one of:
   preliminarily depositing a preliminary adhesion metal, and subsequently electroplating a metal layer.

21. The method of claim 1 wherein steps (c) to (g) comprise creating the lower continuous metallic conducting line and the top conducting line to be I-shaped lines by either panel plating with selective etching or by pattern plating: (i) the lower continuous metallic conducting line, (ii) the metallic via line and (iii) the top conducting line, leaving the I shaped lines embedded in the plurality of dielectric layers.

\* \* \* \* \*